(12) United States Patent
Malakar et al.

(10) Patent No.: US 10,873,325 B2
(45) Date of Patent: Dec. 22, 2020

(54) ROBUST NOISE IMMUNE, LOW-SKEW, PULSE WIDTH RETAINABLE GLITCH-FILTER

(71) Applicant: TEXAS INSTRUMENTS INCORPORATED, Dallas, TX (US)

(72) Inventors: Jhankar Malakar, West Bengal (IN); Srikanth Srinivasan, Bengaluru (IN); Devraj Matharampallil Rajagopal, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/531,180

(22) Filed: Aug. 5, 2019

(65) Prior Publication Data

US 2020/0119726 A1 Apr. 16, 2020

(30) Foreign Application Priority Data

Oct. 12, 2018 (IN) .............................. 201841038829

(51) Int. Cl.
*H03K 5/1252* (2006.01)
*H03K 17/687* (2006.01)
*H03K 17/0416* (2006.01)
*H03K 5/00* (2006.01)

(52) U.S. Cl.
CPC ..... *H03K 5/1252* (2013.01); *H03K 17/04163* (2013.01); *H03K 17/6872* (2013.01); *H03K 2005/00019* (2013.01)

(58) Field of Classification Search
CPC .................................................... H03K 5/1252
See application file for complete search history.

(56) References Cited

U.S. PATENT DOCUMENTS

| | | | | |
|---|---|---|---|---|
| 6,121,813 A * | 9/2000 | Furuchi | ..................... | H03K 5/13 327/285 |
| 7,057,450 B2 * | 6/2006 | Koike | .................. | H03H 19/008 327/311 |
| 8,674,740 B2 * | 3/2014 | Heo | ...................... | H03K 5/1252 327/262 |

OTHER PUBLICATIONS

Malakar, J. et al. "Noise Immune, Low-Skew, Pulse Width Retainable Analog Glitch-Filter." Lecture Paper. 2019 IEEE International Symposium on Circuits and Systems. Print ISBN: 978-1-7281-0397-6. 4 pages.

* cited by examiner

*Primary Examiner* — Hai L Nguyen
(74) *Attorney, Agent, or Firm* — John R. Pessetto; Charles A. Brill; Frank D. Cimino (57) ABSTRACT

An Inter-IC interface with a glitch filter including at least two cascaded RC filters configured to compensate a signal skew of the data or clock signal received from a data communication or clock signal line, feedback switches configured to pull up or pull down a voltage at an output node of each of the at least two cascaded RC filters, and feedforward transistors configured to condition a respective switches to the feedback switches to accelerate the pull up or the pull down.

19 Claims, 7 Drawing Sheets

FIG. 8

ROBUST NOISE IMMUNE, LOW-SKEW, PULSE WIDTH RETAINABLE GLITCH-FILTER

RELATED APPLICATIONS

This application claims priority to Indian Provisional Application No. 201841038829, filed Oct. 12, 2018, which is hereby incorporated by reference.

BACKGROUND

Low frequency interfaces in Integrated Circuits (ICs) experiencing low slew rates are prone to picking up external noise from a system, such as glitches. These glitches may be detected by the ICs, resulting in timing and functional failures. Interface standards, therefore, require not only hysteresis on the thresholds of input buffers receiving noise-prone signals, but also a glitch filtering circuit suppressing rail-to-rail spikes of specified pulse widths that may pass through the hysteresis circuits. The standards for widely used two-wire Inter-IC ($I^2C$) interface, for instance, requires that an $I^2C$ compliant input buffer to suppress glitches on $I^2C$ clock and data pins.

A glitch filter configured to suppress glitches is conventionally implemented as an analog resistor-capacitor (RC) circuit whose resistor and capacitor values are chosen according to the pulse width to be suppressed. Such a topology, however, suffers from a duty cycle distortion, pulse dipping and supply noise susceptibility—issues that produce both functional as well as critical timing failures at a system level.

SUMMARY

An aspect of the present invention provides a glitch filter with at least two coupled RC filters to minimize delay skews based on a RC filter or an inverter of the glitch filter.

Another aspect of the present invention provides a glitch filter with feedback and feedforward switches coupled to a RC filter to efficiently pull up or pull down an output voltage of the RC filter to rails and prevent noises in output signals of the glitch filter.

Another aspect of the present invention provides a glitch filter with input switches coupled to a RC filter to pull up or pull down an output voltage of the RC filter based on an input signal provided to the glitch filter and condition an output voltage of the RC filter to revert to its previous rail based on a change of the input signal.

BRIEF DESCRIPTION OF THE DRAWINGS

For a detailed description of various examples, reference will now be made to the accompanying drawings in which.

DETAILED DESCRIPTION

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Further, in the following detailed description, reference is made to certain examples of the present invention. These examples are described with sufficient detail to enable those skilled in the art to practice them.

Figure 1:
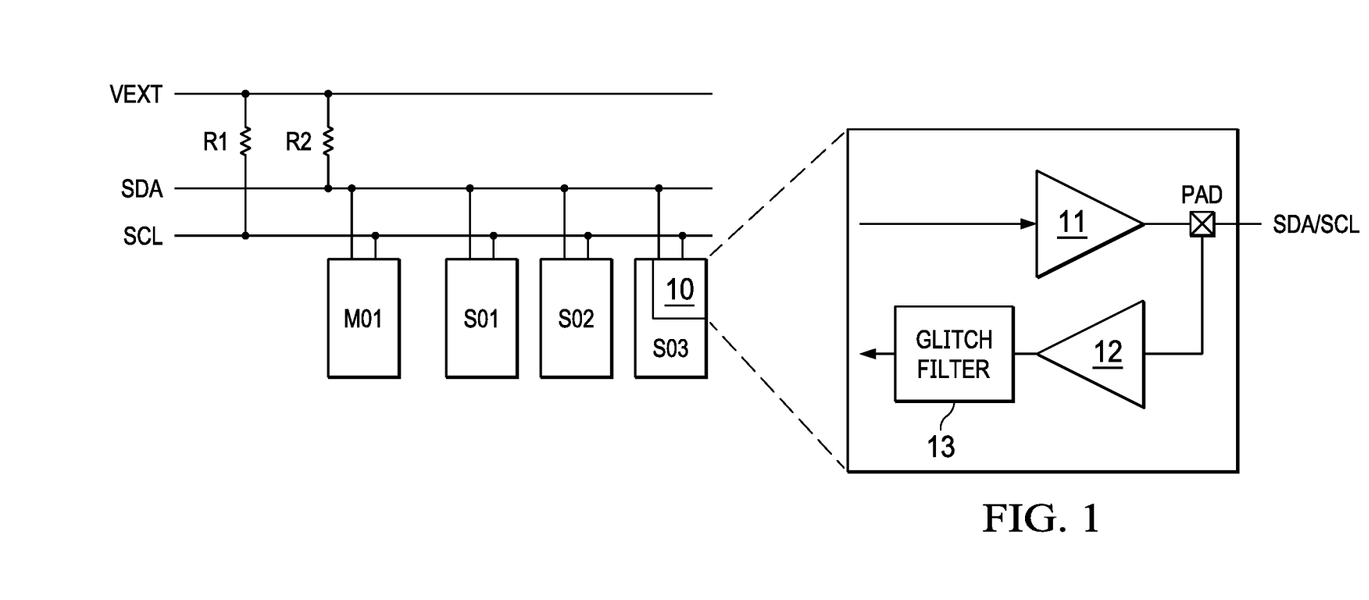
FIG. 1 illustrates an exemplary $I^2C$ system architecture.

FIG. 1 illustrates an exemplary $I^2C$ system architecture with a glitch filter. In the example of FIG. 1, master device M01 is coupled to three slave devices, S01, S02, S03. Master device M01 communicates with slave devices S01, S02, S03 via data communication line SDA pursuant to clock signal transmitted via clock signal line SCL. Data communication line SDA and clock signal line SCL are driven by external power supply VEXT.

Master device M01 and slave devices S01, S02, S03 incorporate input-output interface 10 to receive and transmit signals through data communication line SDA and clock signal line SCL. Input-output interface 10 includes output buffer 11 configured to store data transmitted to data communication line SDA, pin PAD coupled to data communication line SDA or clock signal line SCL, input buffer 12 configured to store data or clock signal received from data communication line SDA or clock signal line SCL, respectively, via pin PAD, and glitch filter 13 coupled to input buffer 12 and configured to suppress noise in the received data or clock signal. In one example, glitch filter 13 may include a RC circuit suppressing the noise.

Figure 2:
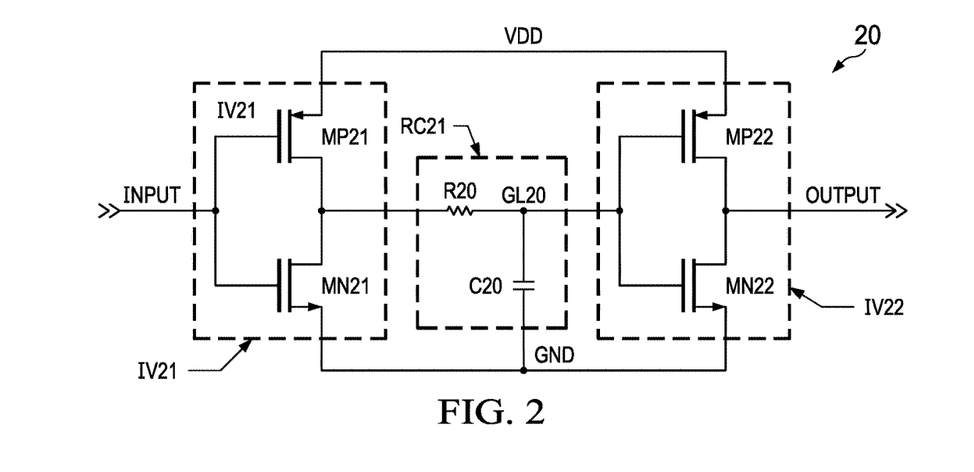
FIG. 2 illustrates a glitch filter according to a prior art.

FIG. 2 illustrates a glitch filter according to a prior art. In the glitch filter of FIG. 2, noises and input spikes are suppressed via a basic RC filter RC20 that slows down signal INPUT provided to glitch filter 20. In particular, signal INPUT to glitch filter 20 is inverted via input inverter IV21 and applied to RC filter RC20. When the voltage of node GL20 is above a certain level, e.g., output inverter IV22's trip point, output inverter IV22 outputs signal OUTPUT.

Signal OUTPUT corresponds to signal INPUT yet is delayed in comparison. The delay of signal OUTPUT is determined by the values of resistor R20 and capacitor C20 of RC filter RC20. In one example of FIG. 2 glitch filter, the values of resistor R20 and capacitor C20 may be chosen to cross output inverter IV22's trip point only if signal INPUT stays low or high for at least 50 ns. Input inverter IV21 includes PMOS transistor MP21 and NMOS transistor MN21. Output inverter IV22 includes PMOS transistor MP22 and NMOS transistor MN22.

The glitch filter of FIG. 2 suffers from three issues. First, since node GL20 has a slow slew rate by construct, it is highly sensitive to input noise and ground bounce. This, in turn may lead glitch filter 20 to generate a false output signal, which is not based on signal INPUT, and cause functional failures. Second, the slow slew rate may cause the flip point of output inverter IV22 to vary, which in turn leads to high delay skews. Third, when signal INPUT toggles at a rate less than 5*(resistor value of resistor R20)*(capacitor value of capacitor C20), node GL20 fails to toggle rail-to-rail, e.g., from VDD to GND. This results in clippings on signal OUTPUT across its corners and unpredictable pulse width variability.

Figure 3:
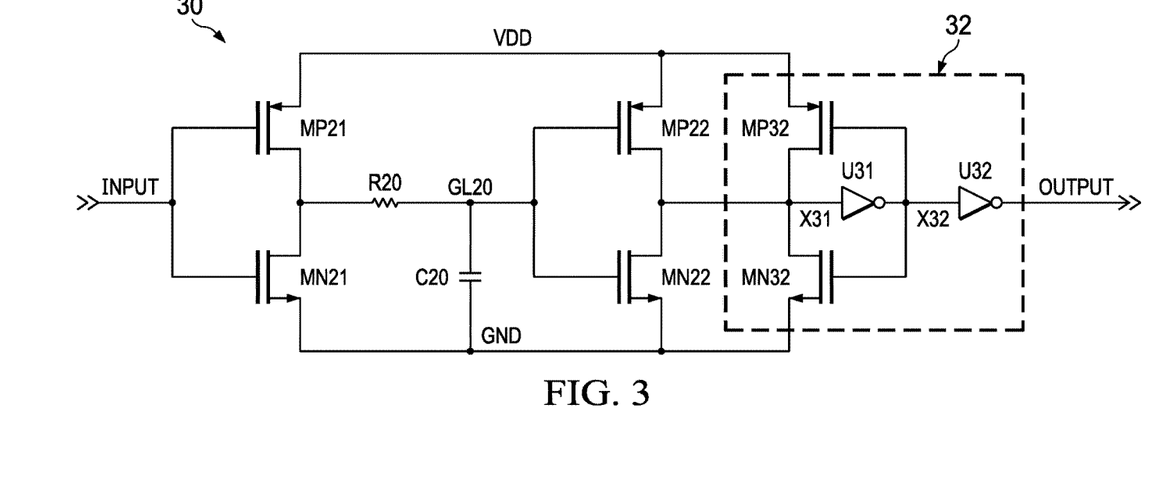
FIG. 3 illustrates a glitch filter according to yet another prior art.

FIG. 3 illustrates a glitch filter according to yet another prior art. The glitch filter 30 of FIG. 30 includes hysteresis circuitry 32 coupled to glitch filter 20 of FIG. 2. Hysteresis circuitry 32 includes PMOS transistor MP32 coupled to PMOS transistor MP22, NMOS transistor MN32 coupled to NMOS transistor MN22, inverter U31 coupled to PMOS transistor MP32 and NMOS transistor MN32, and inverter U32 coupled to inverter U31.

In glitch filter 30, PMOS transistor MP32 and NMOS transistor MN32 are biased by an output from inverter U31, which mirrors the value of signal INPUT. For instance, where signal INPUT is low, the value of node GL20 is high, which renders the value of node X31 low, the value of node X32 high, and signal OUTPUT high. Conversely, when signal INPUT is high, the value of node GL20 is low, which renders the value of node X31 high, the value of node X32 low, and signal OUTPUT low. Because PMOS transistor MP32 and NMOS transistor MN32 are biased by the output of inverter U31, mirroring signal INPUT, the transistors MP32 and MN32 provide hysteresis and noise immunity to glitch filter 30.

Glitch filter 30, however, only suppresses noise amplitude less than the hysteresis offered by transistors MP32 and MN32. With a system with low operating voltages, obtaining high enough hysteresis to effectively suppress noises is a challenge. Furthermore, when a noise amplitude is within the range of hysteresis, the hysteresis circuitry 32 may aggravate a glitch by delaying a transition from high to low, or from low to high, in a signal. Even with the improved noise immunity, glitch filter 30 continues to experience issues such as high delay skews or pulse clippings.

Figure 4:
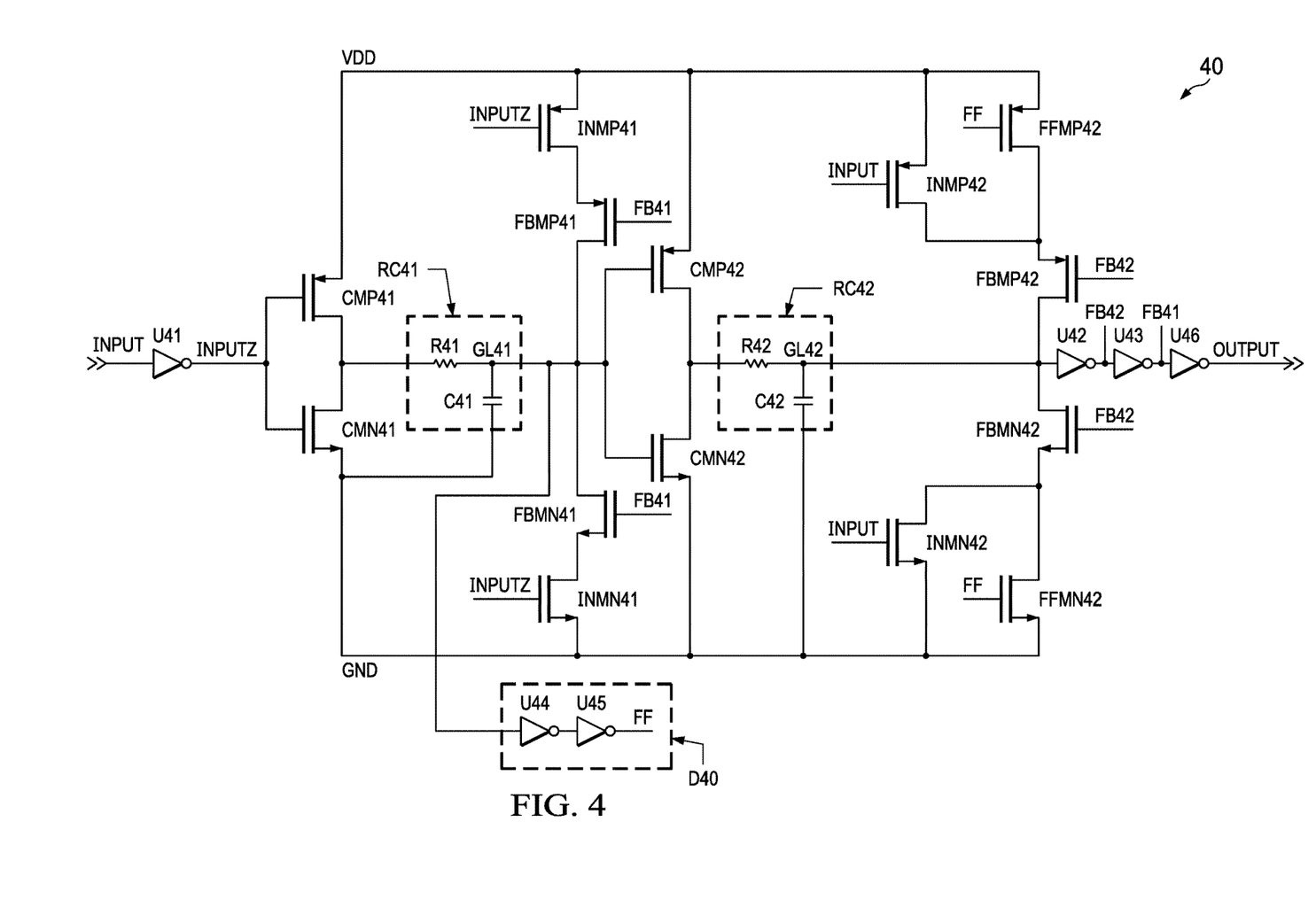
FIG. 4 illustrates a glitch filter according to an aspect of the present invention.

FIG. 4 illustrates a glitch filter according to an aspect of the present invention. In the example of FIG. 4, glitch filter 40 comprises a first set of CMOS transistors CMP41, CMN41, first RC filter RC41 coupled to an output of the first set of CMOS transistors CMP41, CMN41, a second set of CMOS transistors CMP42, CMN42 coupled to output voltage node GL41 of first RC filter RC41, and second RC filter RC42 coupled to an output of the second set of CMOS transistors CMP42, CMN42. Glitch filter 40 further includes input inverter U41, which is coupled to the first set of CMOS transistors CMP41, CMN41 and configured to invert signal INPUT provided to glitch filter 40, and output inverter U42, which is coupled to output signal node GL42 of second RC filter RC42 and configured to invert a signal from output signal node GL42.

First RC filter RC41 and second RC filter RC42 are cascaded via the second set of CMOS transistors CMP42, CMN42, which is configured to function as an inverter. Also, as noted above, output signal node GL42 is coupled to output inverter U42. The cascade architecture and coupling of inverters address the problem of delay skews as the tripping points of the second set of CMOS transistors CMP42, CMN42 and output inverter U42 are set to track each other's variations.

For instance, a rising edge of signal INPUT may be delayed more than a falling edge at output signal node GL42 due to a shift in the tripping point of the second set of CMOS transistors CMP42, CMN42. Output inverter U42 is set to shift a falling edge of its output signal to compensate for the shift of the falling edge caused by the second set of CMOS transistors CMP42, CMN42. Accordingly, output inverter U42 de-skews the delay skews caused by the second set of CMOS transistors CMP42, CMN42.

Glitch filter 40 further includes a first set of feedback transistors FBMP41, FBMN41 coupled to output voltage node GL41 of first RC filter RC41, a second set of feedback transistors FBMP42, FBMN42 coupled to output signal node GL42 of second RC filter RC42, and feedback inverter U43 coupled to output inverter U42. The first set of feedback transistors FBMP41, FBMN41 is biased by an output signal FB41 of feedback inverter U43. The second set of feedback transistors FBMP42, FBMN42 is biased by an output signal FB42 of output inverter U42.

The first set of feedback transistors FBMP41, FBMN41 and the second set of feedback transistors FBMP42, FBMN42 respectively pulls output voltage node GL41 and output signal node GL42 to rails to stabilize and prevent noise from signal OUTPUT of glitch filter 40. Glitch filter 40 generates signal OUTPUT that mirrors signal INPUT with delays based on inverters of glitch filter, e.g., input inverter U41, output inverter U42, feedback inverter U43, first set of CMOS transistors CMP41, CMN41, and second set of CMOS transistors CMP42, CMN42. As soon as signal OUTPUT transitions from low to high, or high to low, to mirror the high and low stage of signal INPUT, output inverter U42 biases (via signal FB42) the second set of feedback transistors FBMP42, FBMN42 to pull up or pull down, respectively, the voltage of output signal node GL42. Similarly, feedback inverter U43 biases (via signal FB41) the first set of feedback transistors FBMP41, FBMN41 to pull up or pull down, respectively, the voltage of output voltage node GL41. The pull up or pull down of voltage at nodes GL41, GL42 stabilizes the voltage at these nodes, which results in faster rising and falling edges at output voltage node GL41 and output signal node GL42. This makes the outputs from output voltage node GL41 and output signal node GL42 immune to supply noise, which may result in signal OUTPUT with sharper rising and falling edges and immune to noise.

Glitch filter 40 further includes a set of feedforward transistors FFMP42 and FFMN42, and delay logic D40. Delay logic D40 is further coupled to output voltage node GL41 and configured to delay an output of output voltage node GL41 to bias the set of feedforward transistors FFMP42 and FFMN42 via signal FF. Feedforward transistor FFMP42 is coupled to feedback transistor FBMP42 and feedforward transistor FFMN42 is coupled to feedback transistor MN42.

Rising and falling edges of signal FF precedes the corresponding rising and falling edges of signal FB42. Accordingly, feedforward transistor FFMP42 turns on and turns off before feedback transistor FBMP42 is turned on and turned off based on signal FB42. By turning on before feedback transistor FBMP42, feedforward transistor FFMP42 conditions feedback transistor FBMP42 to pull up the voltage of output signal node GL42 more rapidly to VDD when feedback transistor FBMP42 is finally turned on. Similarly, feedforward transistor FFMN42 turns on and turns off before feedback transistor FBMN42 is turned on and turned off based on signal FB42. By turning on before feedback transistor FBMN42, feedforward transistor FFMN42 conditions feedback transistor FBMN42 to pull down the voltage of output signal node GL42 more rapidly to GND when feedback transistor FBMN42 is finally turned on.

Delay logic D40 includes inverter U44 and inverter U45 coupled in series to each other. Inverters U44, U45 delay an output of output voltage node GL41 and generate signal FF to bias the set of feedforward transistors FFMP42, FFMN42.

Glitch filter 40 further includes a first set of input biased transistors INMP41, INMN41 and a second set of input biased transistors INMP42, INMN42. The first set of input biased transistors INMP41, INMN41 is biased by an output from input inverter U41 (via signal INPUTZ). The second set of input biased transistors INMP42, INMN42 is biased by signal INPUT. The first set of input biased transistors INMP41, INMN41 is configured to revert the voltage at output voltage node GL41 to its previous rail where a pulse width of signal INPUT is shorter than a preset width. Similarly, the second set of input biased transistors INMP42, INMN42 is configured to revert the voltage at output signal node GL42 to its previous rail where a pulse width signal INPUT is shorter than a preset width.

In glitch filter 40, the sets of feedback transistors FBMP41, FBMN41, FBMP42, FBMN42 or the set of feedforward transistors FFMP42, FFMN42 may operate to continue to pull up or pull down even if signal INPUT has transitioned from high to low, or from low to high. The first and second sets of input biased transistors INMP41, INMN41, INMP42, INMN42 assure that the voltage at output voltage node GL41 and output signal node GL42 is pulled up or pulled down based on signal INPUT. For instance, where signal INPUT transitions from high to low before the voltage of output signal node GL42 crosses the trip point of output inverter U42, the second set of input biased transistors INMP42, INMN42 will pull down the voltage of output signal node GL42 to GND immediately. This allows for the next pulse of signal INPUT, the voltage at output signal node GL42 begins from GND.

The operations of the switches and transistors of glitch filter 40 is further described in relation to below Table 1 and FIG. 5, which illustrates signal waveforms of glitch filter 40.

TABLE 1

Figure 5:
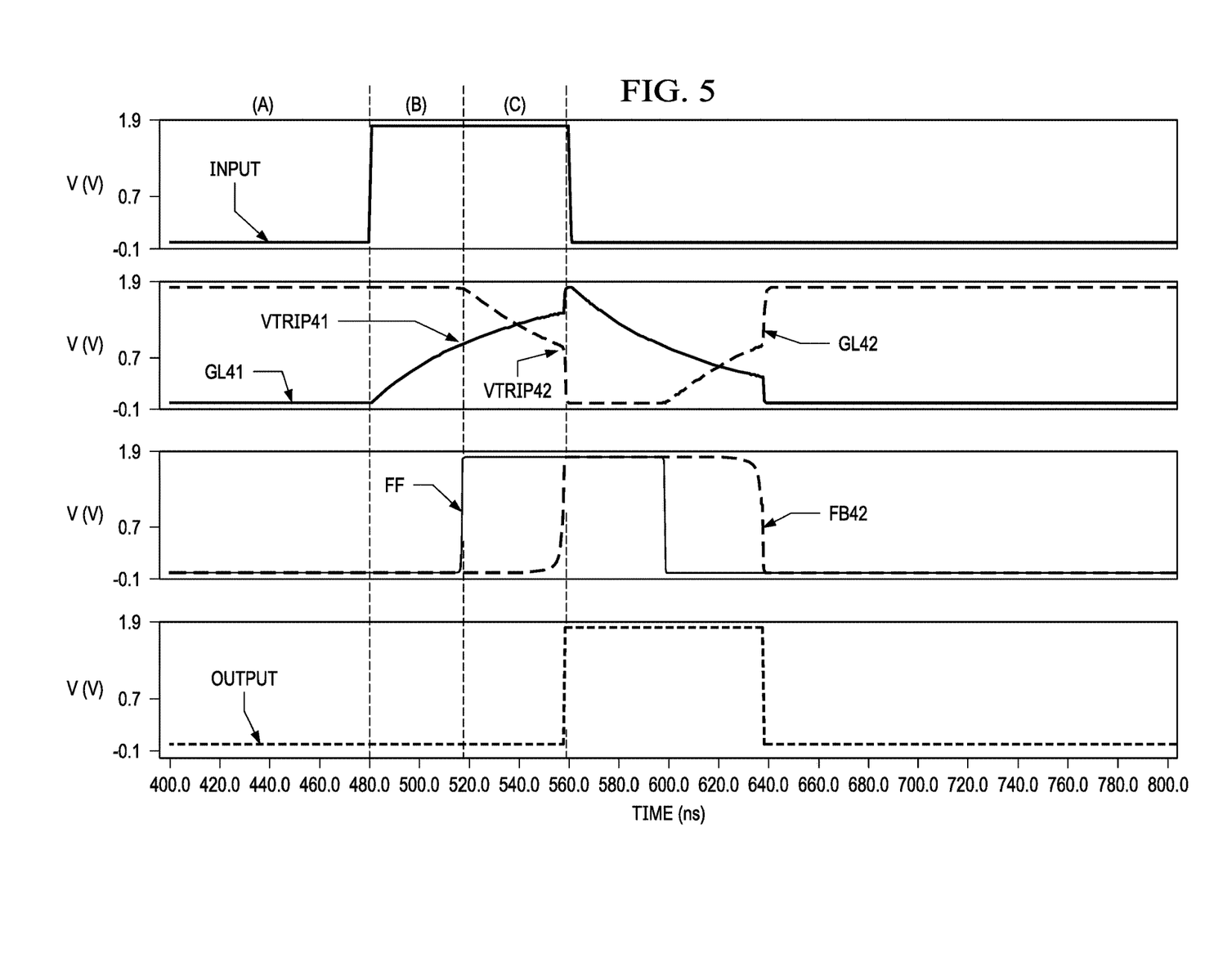
FIG. 5 illustrates signals of the glitch filter of FIG. 4, and FIG. 6-8 illustrate signals of the glitch filters of prior art and FIG. 4 in comparison.

| Event | Signal INPUT | GL41 | Signal FF | GL42 | Signal FB42 | Signal OUTPUT | Comment |
|---|---|---|---|---|---|---|---|
| Static 0 | 0 | 0 | 0 | 1 | 0 | 0 | See Section (A) of FIG. 5 |
| 0 to 1 | 1 | 1 | 1 | >VTRIP42 | 0 | 0 | See Section (B) of FIG. 5 |
|  |  |  |  | <VTRIP42 | 1 | 1 | See Section (C) of FIG. 5 |
| Static 1 | 1 | 1 | 1 | 0 | 1 | 1 |  |
| 1 to 0 | 0 | 0 | 0 | <VTRIP42 | 1 | 1 |  |
|  |  |  |  | <VTRIP42 | 0 | 0 |  |

Where signal INPUT is static low, e.g., has a value of "0", transistor CMP41 is off and transistor CMN41 is on. The voltage of output voltage node 41 of first RC filter RC41 is pulled down to GND, and is reflected in above Table 1 as carrying a value of "0". Transistor CMP42 is on while transistor CMN42 is off, rendering the voltage of output signal node 42 of second RC filter RC42 high ("1"). Signal FF, which corresponds to the value of signal INPUT, yet delayed, has a value of "0". Signal FB42 of output inverter U42 is also "0". Accordingly, feedforward transistor FFMP42, feedback transistor FBMP42, and input biased transistor INMP42 are turned on to hold the voltage of output signal node GL42 to VDD. Feedforward transistor FFMN42, feedback transistor FBMN42, and input biased transistor INMN42 are turned off. See section (A) of FIG. 5.

When signal INPUT transitions from low to high, the voltage of output voltage node GL1 starts to increase until the voltage crosses the trip voltage of the second set of CMOS transistors CMP42, CMN42, and inverter U44 of delay logic D40. See section (B) of FIG. 5. When the voltage of output voltage node GL41 crosses the trip voltage (VTRIP41 of FIG. 5) of the second set of CMOS transistors CMP42, CMN42, and inverter U44, signal FF becomes high as signal INPUT. Accordingly, feedforward transistor FFMP42 and input biased transistor INMP42 are turned off, even if signal FB42 at the end of section (B) still has a low value of "0" and feedback transistor FBMP42 is still on. Conversely, feedforward transistor FFMN42 and input biased transistor INMN42 are turned on, even if feedback transistor FBMN42 is still off.

Because feedforward transistor FFMP42 and input biased transistor INMP42 are turned off, as soon as the voltage of output voltage node GL41 crosses trip voltage VTRIP41, the voltage of output signal node GL42 is released from VDD and starts to decrease. During this period (section (C) of FIG. 5), signal FB42 and signal OUTPUT is still low. When the voltage of output signal node GL42 cross the trip voltage (VTRIP42 of FIG. 5) of output inverter U42, signal FB42 turns high. A high signal FB42 turns off feedback transistor FBMP42 while turning on feedback transistor FBMN42. As both feedforward transistor FFMN42 and feedback transistor FFMN42 are turned on, the voltage of output signal node GL42 is pulled to GND, making signal OUTPUT immune to noise.

Conversely, when signal INPUT is static "1", voltage of output voltage node GL41 and signal FF both have a value of "1", voltage of output signal node GL42 has a value of "0", and signal FB42 and signal OUTPUT both have a value of "1".

When signal INPUT transitions from "1" to "0", signal INPUT, voltage of output voltage node GL41 and signal FF have a value of "0". Signal FB42 and signal OUTPUT, however, still maintains a value of "1" until the voltage of output signal node GL42 crosses the trip voltage VTRIP42.

After the voltage of output signal node GL42 crosses the trip voltage VTRIP42, signal FB42 and signal OUTPUT both output a value of "0", which is immune to noise.

During section (B) of FIG. 5, if signal INPUT goes back to "0" before the voltage at output signal node GL42 crosses trip voltage VTRIP42, signal FB42 still remains low (and signal FB41 still high). Signal INPUT going low, however, will revert the voltage of output signal node GL42 to its previous value of "1" by turning on input biased transistor INMP42 and pulling up the voltage of output signal node GL42 to VDD immediately. Similarly, signal INPUTZ will return high, revert the voltage of output voltage node GL41 to its previous value of "0" by turning on input biased transistor INMN41 and pulling down the voltage of output voltage node GL41 to GND immediately. Accordingly, for the next pulse, voltages of output voltage node GL41 and output signal node GL42 will start to increase or decrease from the respective rail values, which prevent pulse width clippings.

Figure 6:
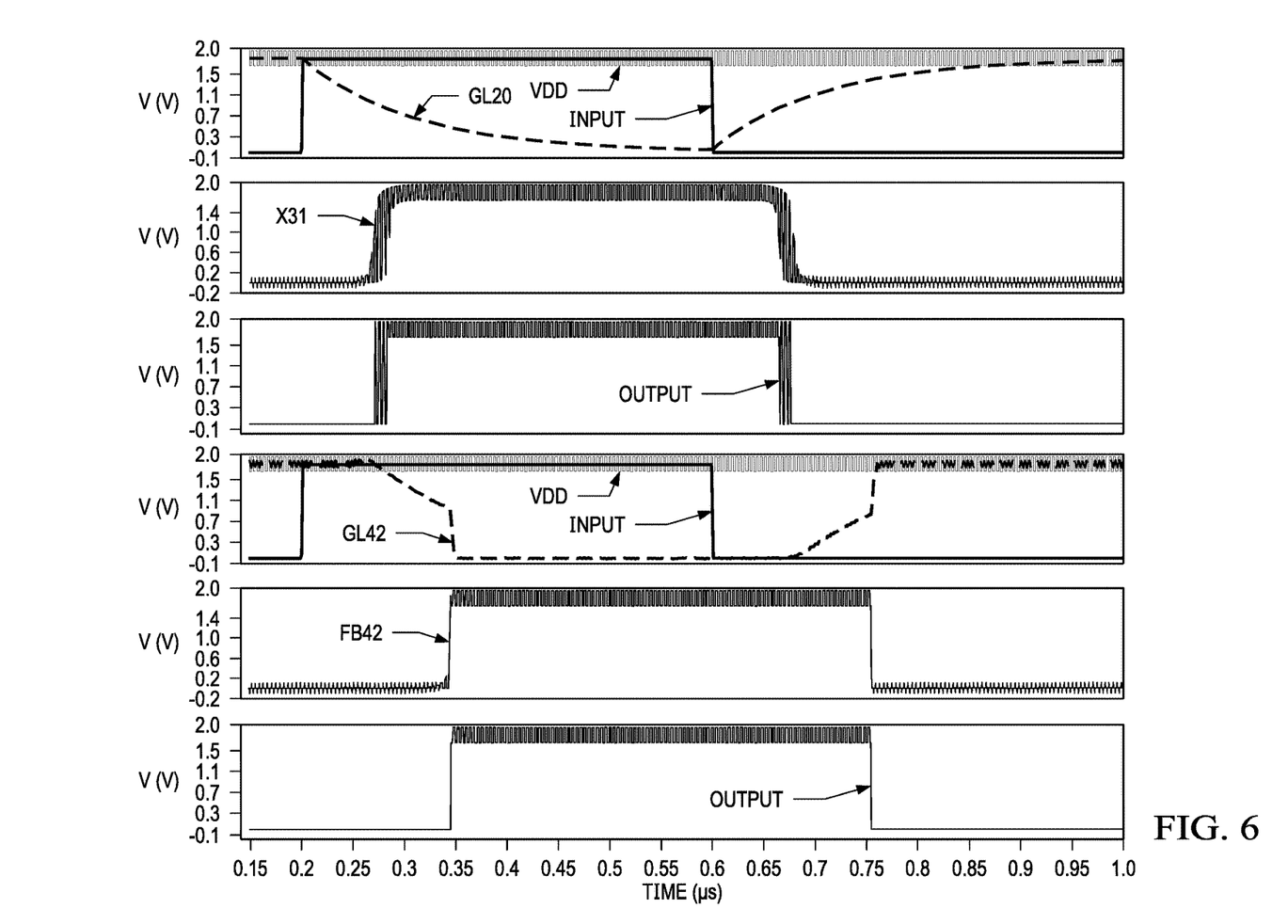
Figure 7:
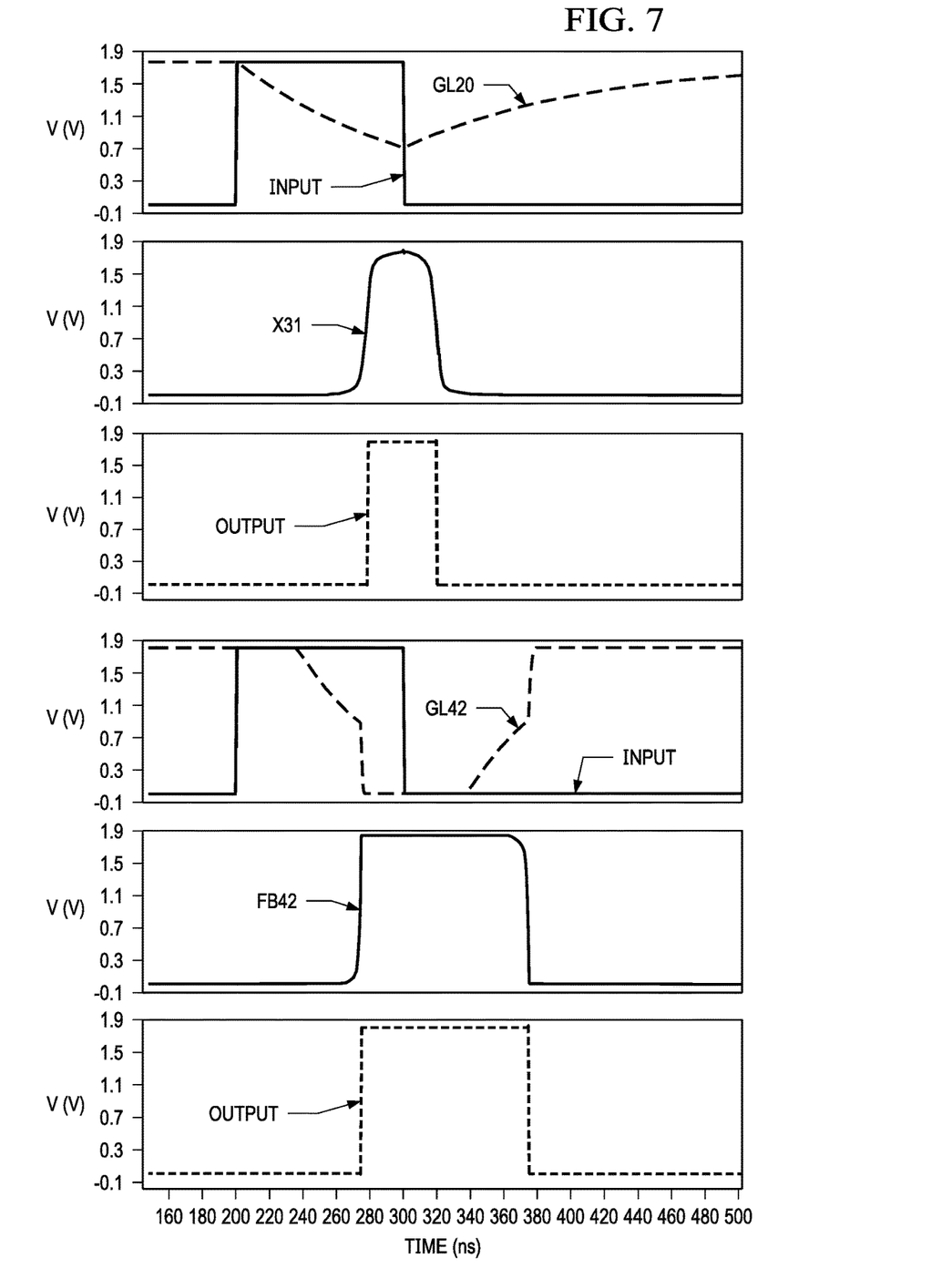
Figure 8:
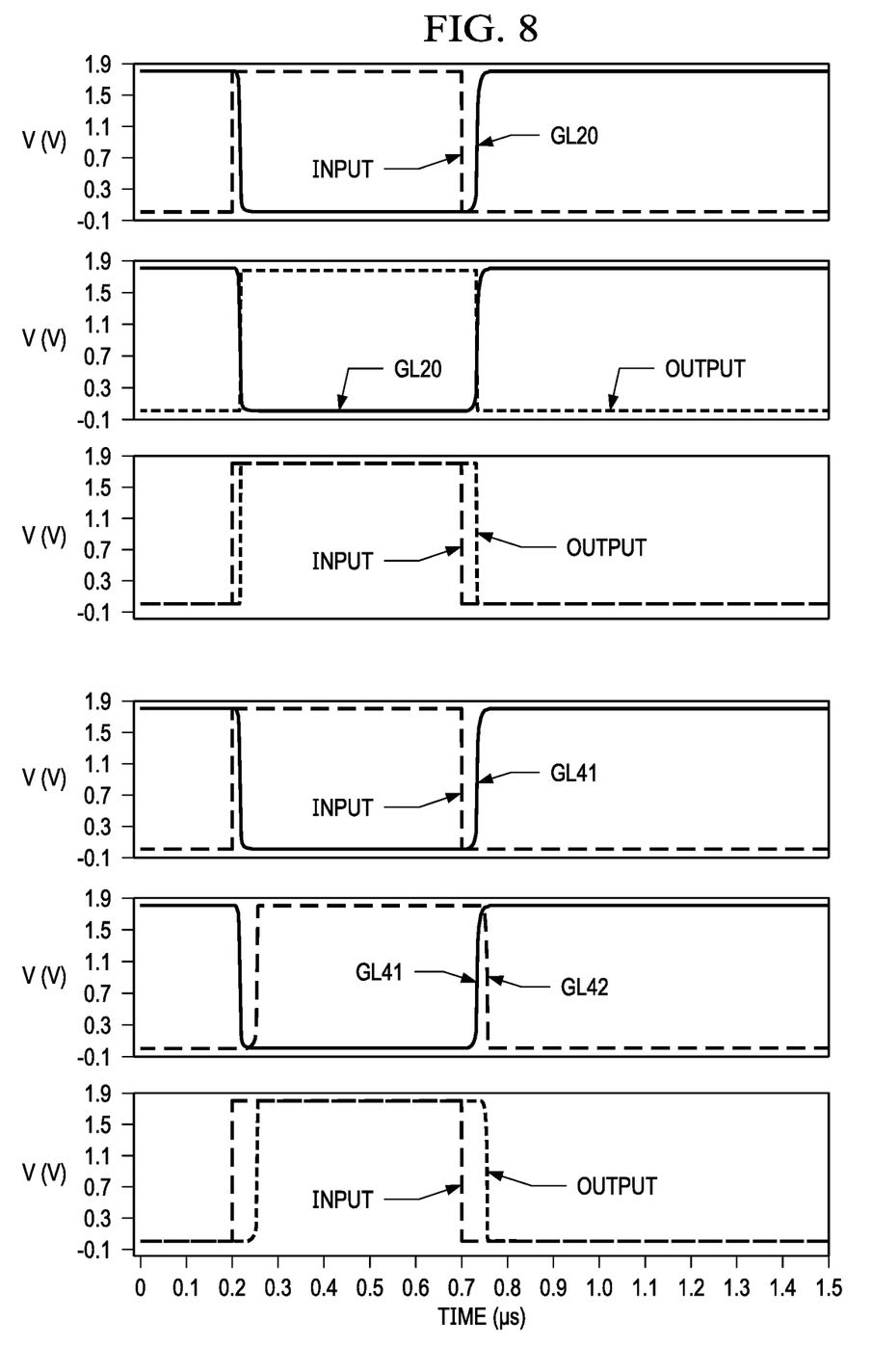

FIGS. 6-8 illustrate the signals of glitch filter 40, in comparison to the signals of a glitch filter according to prior art of FIG. 3. FIG. 6 compares the results of a noise immunity test of the two glitch filters, FIG. 7 a pulse width retention test, and FIG. 8 a delay skew test.

In FIG. 6, signal INPUT of pulse width of 400 ns is provided to the respective glitch filters with supply noise of 100 mV peak and 500 MHz frequency. In FIG. 6(a), the voltage at node GL20 decreases as soon as the input pulse is applied to the prior art glitch filter; noise is observed in both at input node X31 of inverter U31 and signal OUTPUT. In FIG. 6(b), the voltage at output signal node GL42 starts decreasing about 75 ns after the rising edge of the input pulse, and less noise is observed in both signal FB42 and signal OUTPUT.

In FIG. 7, signal INPUT of pulse width of 100 ns is provided to the respective glitch filters. In FIG. 7(a), the voltage at node GL20 decreases and increases according to the conventional characteristics of a RC filter, which results in shorter than 100 ns width of high voltage at input node X31 of inverter U31 and signal OUTPUT. In FIG. 7(b), the voltage at output signal node GL42 is immediately pulled down and pulled up after crossing the trip point, which results in close to longer pulse width in both signal FB42 and signal OUTPUT.

In FIG. 8, signal OUTPUT in relation to signal INPUT is illustrated. In FIG. 8(a), the top waveform reflects signal INPUT and the voltage at node GL20, the middle waveform reflects signal OUTPUT (which is simply an inversion of the voltage at node GL20) in relation to the voltage at node GL20, and bottom waveform reflects signal OUTPUT in relation to signal INPUT. As illustrated, delay is observed in signal OUTPUT of the glitch filter of prior art. In FIG. 8(b), the top waveform reflects signal INPUT and the voltage at output voltage node GL41, the middle waveform reflects the voltage at output voltage node GL41 and at output signal node GL42, and bottom waveform reflects signal OUTPUT in relation to signal INPUT. Signal OUTPUT in glitch filter 40 follows second RC filter RC42. In the bottom waveform of FIG. 8(b), delay skew has been removed.

It is to be understood that other examples may be employed and that various structural, logical, and electrical changes may be made. Modifications are possible in the described embodiments, and other embodiments are possible, within the scope of the claims.

What is claimed is:

1. A glitch filter comprising:
a first set of CMOS transistors;
a first resistor-capacitor (RC) filter coupled to the first set of CMOS transistors;
a second set of CMOS transistors coupled to the first RC filter;
a second RC filter coupled to the second set of CMOS transistors; and
an output inverter coupled to the second RC filter,
wherein the first set of CMOS transistors is configured to apply high or low voltage to the first RC filter based on an input signal provided to the glitch filter;
the first RC filter is configured to generate output voltage based on the high or low voltage applied to the first RC filter by the first set of CMOS transistors;
the second set of CMOS transistors is configured to apply high or low voltage to the second RC filter based on the output voltage generated by the first RC filter;
the second RC filter is configured to generate an output signal corresponding to the input signal provided to the first set of CMOS transistors based on the high or low voltage applied to the second RC filter by the second set of CMOS transistors, and
the output inverter is configured to delay a rising edge or a falling edge of the output signal to compensate a signal skew based on the first set of CMOS transistors or the second set of CMOS transistors.

2. The glitch filter of claim 1 further comprising,
a first set of feedback switches coupled to the first RC filter;
wherein the first set of feedback switches is configured to pull up or pull down the output voltage of the first RC filter based on the output signal generated by the second RC filter.

3. The glitch filter of claim 2,
wherein the glitch filter further comprises a feedback inverter coupled to the output inverter, and configured to output a first feedback signal based on an output of the output inverter and bias the first set of feedback switches,
wherein the first set of feedback switches comprises,
a first feedback PMOS transistor of which a drain is coupled to an output voltage node of the first RC filter, a source is coupled to a high voltage supply, and a gate is coupled to an output of the feedback inverter, and
a first feedback NMOS transistor of which a drain is coupled to the output voltage node of the first RC filter, a source is coupled to a low voltage supply and a gate is coupled to the output of the feedback inverter, and
wherein the first feedback PMOS transistor is configured to be turned on to pull up the voltage of the output voltage node to a voltage of the high voltage supply when the first feedback signal output from the feedback inverter is low, and the first feedback NMOS transistor is configured to be turned on to pull down the voltage of the output voltage node to a voltage of the low voltage supply when the first feedback signal output from the feedback inverter is high.

4. The glitch filter of claim 2 further comprising,
a first set of input biased switches coupled to the first set of feedback switches,
wherein the first set of input biased switches is configured to revert the output voltage of the first RC filter to a previous rail when a pulse width of the input signal provided to the glitch filter is shorter than a preset pulse width.

5. The glitch filter of claim 4,
wherein the glitch filter further comprises an input inverter coupled to the first set of CMOS transistors, and configured to output an inverted input signal based on the input signal and bias the first set of input biased switches,
wherein the first set of input biased switches comprises,
a first input PMOS transistor of which a source is coupled to a high voltage supply, a drain is coupled to a first feedback switch of the first set of feedback switches, and a gate is coupled to an output of the input inverter, and
a first input NMOS transistor of which a source is coupled to a low voltage supply, a drain is coupled to a second feedback switch of the first set of feedback switches, and a gate is coupled to the output of the input inverter, and
wherein the first input PMOS transistor is configured to be turned on when the inverted input signal from the input inverter is low, and the first input NMOS transistor is configured to be turned on when the inverted input signal from the input inverter is high.

6. The glitch filter of claim 1 further comprising,
a second set of feedback switches coupled to the second RC filter;
wherein the second set of feedback switches is configured to pull up or pull down a voltage of the output signal of the second RC filter based on the output signal generated by the second RC filter.

7. The glitch filter of claim 6,
wherein the second set of feedback switches comprises,
- a second feedback PMOS transistor of which a drain is coupled to an output signal node of the second RC filter, a source is coupled to a high voltage supply, and a gate is coupled to an output of the output inverter, and
- a second feedback NMOS transistor of which a drain is coupled to the output signal node of the second RC filter, a source is coupled to a low voltage supply and a gate is coupled to the output of the output inverter, and wherein the output inverter is configured to output a second feedback signal to bias the second feedback PMOS and NMOS transistors based on the output signal of the second RC filter, the second feedback PMOS transistor is configured to be turned on to pull up the voltage of the output signal node to a voltage of the high voltage supply when the second feedback signal output from the output inverter is low, and the second feedback NMOS transistor is configured to be turned on to pull down a voltage of the output signal node to a voltage of the low voltage supply when the second feedback signal output from the output inverter is high.

8. The glitch filter of claim 6 further comprising,
a second set of input biased switches coupled to the second RC filter,
wherein the second set of input biased switches are configured to revert the voltage of the output signal of the second RC filter to a previous rail when a pulse width of the input signal provided to the glitch filter is shorter than a preset pulse width.

9. The glitch filter of claim 8,
wherein the second set of input biased switches comprises,
- a second input PMOS transistor of which a source is coupled to a high voltage supply, a drain is coupled to a first feedback switch of the second set of feedback switches, and a gate is configured to be biased by the input signal, and
- a second input NMOS transistor of which a source is coupled to a low voltage supply, a drain is coupled to a second feedback switch of the second set of feedback switches, and a gate is configured to be biased by the input signal, and wherein the second input PMOS transistor is configured to be turned on when the input signal is low, and the second input NMOS transistor is configured to be turned on when the input signal is high.

10. The glitch filter of claim 6 further comprising,
a set of feedforward switches coupled to the second set of feedback switches,
wherein each switch of the set of feedforward switches is coupled to a respective switch of the second set of feedback switches, and
the each switch of the set of feedforward switches is configured to be turned on or turned off before the respective switch of the second set of feedback switches is turned on or turned off.

11. The glitch filter of claim 10,
wherein the glitch filter further comprises a delay logic coupled to an output voltage node of the first RC filter, and configured to output a feedforward signal based on a delayed output voltage of the first RC filter and bias the set of feedforward switches,
wherein the set of feedforward switches comprises,
- a feedforward PMOS transistor of which a source is coupled to a high voltage supply, a drain is coupled to a first feedback switch of the second set of feedback switches, and a gate is coupled to an output of the delay logic, and
- a feedforward NMOS transistor of which a source is coupled to a low voltage supply, a drain is coupled to a second feedback switch of the second set of feedback switches, and a gate is coupled to the output of the delay logic, and wherein the feedforward PMOS transistor is configured to be turned on when the feedforward signal from the delay logic is low, and the feedforward NMOS transistor is configured to be turned on when the feedforward signal from the delay logic is high.

12. The glitch filter of claim 11,
wherein the delay logic is configured to generate the feedforward signal to turn on and turn off the feedforward PMOS transistor before the first feedback switch of the second set of feedback switches is turned on and turned off, respectively, and to turn on and turn off the feedforward NMOS transistor before the second feedback switch of the second set of feedback switches is turned on and turned off, respectively.

13. The glitch filter of claim 11,
wherein the delay logic comprises two inverters coupled in series.

14. A glitch filter comprising;
a set of CMOS transistors;
a resistor-capacitor (RC) filter coupled to the set of CMOS transistors;
an output inverter coupled to the RC filter;
a set of feedback switches coupled to the RC filter and the output inverter; and
a set of feedforward switches coupled to the feedback switches,
  - wherein the set of CMOS transistors is configured to apply high or low voltage to the RC filter based on an input signal provided to the glitch filter;
  - the RC filter is configured to generate an output signal based on the high or low voltage applied to the RC filter by the set of CMOS transistor; and
  - the output inverter is configured to invert the output signal and provide the inverted output signal to the set of feedback switches;
  - the set of feedback switches is configured to pull up or pull down a voltage of the output signal based on the inverted output signal; and
  - the set of the feedforward switches is configured to accelerate the pull up or pull down of the voltage by the set of feedback switches based on a delayed input signal.

15. The glitch filter of claim 14,
wherein the set of feedback switches comprises a feedback PMOS transistor and a feedback NMOS transistor, and the set of feedforward switches comprises a feedforward PMOS transistor and a feedforward NMOS transistor,
wherein a drain of the feedback PMOS transistor is coupled to an output signal node of the RC filter, a source of the feedback PMOS transistor is coupled to the feedforward PMOS transistor, and a gate of the feedback PMOS transistor is configured to be biased by the inverted output signal,
a drain of the feedback NMOS transistor is coupled to the output signal node of the RC filter, a source of the feedback NMOS transistor is coupled to the feedforward NMOS transistor, and a gate of the feedback NMOS transistor is configured to be biased by the inverted output signal,
a source of the feedforward PMOS transistor is coupled to a high voltage supply, a drain of the feedforward PMOS transistor is coupled to the source of the feedback PMOS transistor, and a gate of the feedforward PMOS transistor is configured to be biased by the delayed input signal, and a source of the feedforward NMOS transistor is coupled to a low voltage supply, a drain of the feedforward NMOS transistor is coupled to the source of the feedback NMOS transistor, and a gate of the feedforward NMOS transistor is configured to be biased by the delayed input signal.

16. The glitch filter of claim 15, wherein a rising and falling edge of the delayed input signal is configured to precede a respectively corresponding rising and falling edge of the inverted output signal.

17. The glitch filter of claim 15 further comprising:

a set of input biased switches coupled to the feedback switches, wherein the set of the input biased switches is configured to revert the voltage of the output signal to a previous rail when a pulse width of the input signal is shorter than a preset pulse width.

18. The glitch filter of claim 17, wherein the set of input biased switches comprises an input biased PMOS transistor and an input biased NMOS transistor, a source of the input biased PMOS transistor is coupled to the high voltage supply, a drain of the input biased PMOS transistor is coupled to the source of the feedback PMOS transistor, and a gate of the input biased PMOS transistor is configured to be biased by the input signal, and a source of the input biased NMOS transistor is coupled to the low voltage supply, a drain of the input biased NMOS transistor is coupled to the source of the feedback NMOS transistor, and a gate of the input biased NMOS transistor is configured to be biased by the input signal.

19. The glitch filter of claim 18, wherein a rising and falling edge of the input signal is configured to bias the input biased PMOS and NMOS transistors before a respectively corresponding rising and falling edge of the delayed input signal bias the feedforward PMOS and NMOS transistors.

\* \* \* \* \*